US005789914A

United States Patent [19]
Matthews et al.

[11] Patent Number: 5,789,914
[45] Date of Patent: Aug. 4, 1998

[54] ONBOARD DIGITAL LOCOMOTIVE HORSEPOWER MULTIMETER

[75] Inventors: Jack W. Matthews, 1131 Wheaton Oaks Ct., Wheaton, Ill. 60187; William Stevens, Wheaton, Ill.

[73] Assignee: Jack W. Matthews, Wheaton, Ill.

[21] Appl. No.: 690,451

[22] Filed: Jun. 26, 1996

[51] Int. Cl.$^6$ .................................................. G01R 19/00
[52] U.S. Cl. ................................... 324/115; 73/862.28
[58] Field of Search .................................. 324/115, 503; 73/118.1, 862.28; 303/3; 364/426, 578

[56] References Cited

U.S. PATENT DOCUMENTS

| | | | |
|---|---|---|---|
| 4,234,922 | 11/1980 | Wilde et al. | 364/426 |
| 4,652,057 | 3/1987 | Engle et al. | 303/3 |
| 5,461,908 | 10/1995 | Armstrong | 73/118.1 |
| 5,557,198 | 9/1996 | Matthews et al. | 324/115 |

*Primary Examiner*—Ernest F. Karlsen
*Assistant Examiner*—Anh Phung
*Attorney, Agent, or Firm*—Steven L. Schmid

[57] ABSTRACT

The present invention relates to a digital DC voltage and horse power multimeter device unitized in determining the voltage and horse power on a locomotive system. The meter is permanently mounted onboard the locomotive and is capable of instantaneous determination of the voltage reading and horse power to provide real time evaluation of the locomotive's functions. The meter is built into the voltage test panel, replacing the test receptacles, and is designed to prevent operator error in that a voltage range is not required to be set before the multimeter reads a desired voltage. The meter is capable of reading the main generator, a load shunt test millivoltage, and is capable of determining the horse power of a locomotive system. The invention is therefore a device for metering electrical energy and calculating the horse power on a locomotive system which is permanently installed which operates off the existing 74V DC accessory power and is safer due to the absence of manual range settings.

18 Claims, 1 Drawing Sheet

5,789,914

1

ONBOARD DIGITAL LOCOMOTIVE HORSEPOWER MULTIMETER

BACKGROUND OF THE INVENTION

1. Field of the Invention

The present invention relates to a digital locomotive multimeter, and more particularly to an onboard digital locomotive multimeter capable of reading and displaying a main generator voltage, a load test shunt millivoltage and a horse power reading of a locomotive engine.

2. Background Art

Presently locomotives having an EMD configuration are equipped with a load test panel allowing access jacks for main generator and shunt millivotage. The test jacks are used in combination with a hand held digital DC voltage meter to read the main generator voltage and the load test shunt millivoltage on the locomotive engine. The hand held digital voltage meter is directly connected to the test jacks, with the meter being manually set for the type of voltage the operator desires. While this method may function, it does not provide adequate safety or efficiency of use.

The hand held models used in the industry today are capable of being set to read in at least two separate voltage ranges. The first setting is used to measure the locomotive's main generator voltage, having a voltage potential between 0 and 1500. The second setting is for the load test shunt millivoltage with a millivoltage potential between 0 and 75 millivolts. The voltage potential of the main generator is at least a thousand times greater than the load test shunt millivoltage. This great difference in voltage potential requires the hand held meter to be properly set to read in the voltage range of the corresponding test jacks connected to the meter. If the meter is improperly connected by an operator who inadvertently forgets to set the meter to the correct voltage range an overload can occur. The overload would not only destroy the meter but could cause considerable injury to the operator performing the reading. To eliminate the possibility of personal injury and property damage, a device is needed that is capable of eliminating operator error by preventing the inadvertent missetting of a hand held multimeter.

Currently hand held models used in the industry are dependent on an external power supply source in order to operate. The common power supply source on a locomotive used to run accessory devices like a multimeter is a very uncommon voltage of 74 volts DC. If a hand held multimeter were equipped to connect to an external power supply it would be unable to use the power supply hook-ups within the locomotive engine compartment since the power supply is such a unique voltage. Thus, normally the hand held multimeters are powered by a battery that will eventually need replacing or recharging. The need for replacing or recharging the batteries is an unwanted cost and inconvenience to the maintenance operator. A multimeter capable of using a locomotive's 74 volt DC accessory power supply would prevent the need for an external power supply, such as a battery, and would save time and money for the locomotive operator.

An important function that current hand held multimeters are not equipped for is the displaying of a horse power reading on a locomotive engine. A horse power reading on a locomotive can provide important information to an engineer as to how a locomotive is functioning. The reading must also be current for it to be of any real use. The horse power reading is taken by using a mathematical compilation of both the main generator voltage reading and the load test shunt millivoltage. A multimeter would be required to process both voltages to produce a horse power reading. Thus a multimeter capable of taking a horse power reading along with the voltage reading would be beneficial in the operation of a locomotive.

Hand held multimeters along with their other disadvantages also require time and effort to setup before a reading can be taken. An operator must first find the meter, then the operator must connect the meter to the correct test jacks and then set the voltage range on the meter. The readings must be taken quickly if an operator is to have an indication as to the current operating performance of the locomotive and to any possibility of potential failure of the generator. Thus it is important that the information be readily available anytime an evaluation or running checkup is required. A multimeter capable of running real-time readings on a locomotive is needed for increased efficiency in the operation of a locomotive engine.

An object of the present invention is to provide a permanently mounted onboard multimeter to be installed within the area previously dedicated for the test jacks. A further object of the invention is to provide a multimeter capable of being powered by the locomotive's 74 volt DC accessory power supply. Another object being the invention is able to be power by a 74 volt power supply occurring in spikes and fluctuating between about 36 to 85 volts. A permanently mounted multimeter requires no setup time nor does it require an external supply source, such as a battery.

Yet still another object of the present invention is to provide a multimeter that does not require the selection of a voltage range. This feature increases operational safety of the multimeter by making it impossible for a wrong voltage range to be selected and thus preventing injury to the operator and destruction to the multimeter. Another object of the present invention is to provide for the instantaneous digital display of the voltage readings. A further object of the invention is to provide for a digital display of the current horse power reading of the locomotive engine.

Another object of the present invention is to provide a digital multimeter capable of withstanding the high-potential and meger test which are preformed on the locomotive without having the present invention from being disconnected from the locomotive.

SUMMARY OF THE INVENTION

The invention herein is directed to a method and apparatus for the reading and displaying a main generator voltage, a load test shunt millivoltage and a horse power reading on a locomotive engine. The present invention is permanently installed in an area previously dedicated for the test jacks on a locomotive engine.

The present invention is an onboard digital locomotive multimeter that is capable of reading a pair of voltages and the determination of the horse power of the locomotive engine. The device consists of several circuits, a switch, a microcontroller, and a display. The multimeter has three basic functional groupings: the first grouping reduces the higher input voltages to a level readable for the processing chip with the utilization of a DC to DC converter, the second grouping is for the reading, converting the input voltages to a digital signal; and the third grouping is for data averaging, microprocessing, and displaying the data.

The first grouping is connected to the main generator voltage, load test shunt millivoltage and the 74 volt power supply which are all located within the area previously dedicated for the test jacks on the locomotive. The invention divides the main generator voltage and steps down the 74 volt power supply via the switch to an usable 5 volts to power the invention's components. The first grouping also includes a switch position detector to send the switch position to the microprocessor.

The second grouping first couples the voltages before sending them on to the switch. The switch then individually directs the coupled voltages to an analog to digital converter. The converter then sends the digital signal to the microcontroller within the third grouping.

The third grouping consists of a microcontroller, a clock reducer and a display. The microcontroller calculates the horse power, performs display processing and clock generation. The clock speed from the microcontroller is reduced by the clock reducer and is then sent to the analog to digital converter. The display is connected to the microcontroller and displays the voltages and the horse power readings.

The present invention is capable of reading and analyzing the main generator voltage, the load test shunt millivoltage, and obtaining a horse power reading by processing the two voltage readings. The invention is capable of being powered by the fluctuating 74 volt accessory power supply of the locomotive and is able to withstand the high voltage tests performed on the locomotive. The present invention also provides added safety along with quick and accurate results.

BRIEF DESCRIPTION OF THE DRAWINGS AND FIGURES

The preferred embodiment of the present invention is described in detail below with reference to the attached drawing figures, wherein;

FIG. 1 is a block diagram of the onboard multimeter capable of reading and displaying a main generator voltage, a load shunt millivoltage and a horse power reading on a locomotive engine.

DETAILED DESCRIPTION OF THE INVENTION

Figure 1:
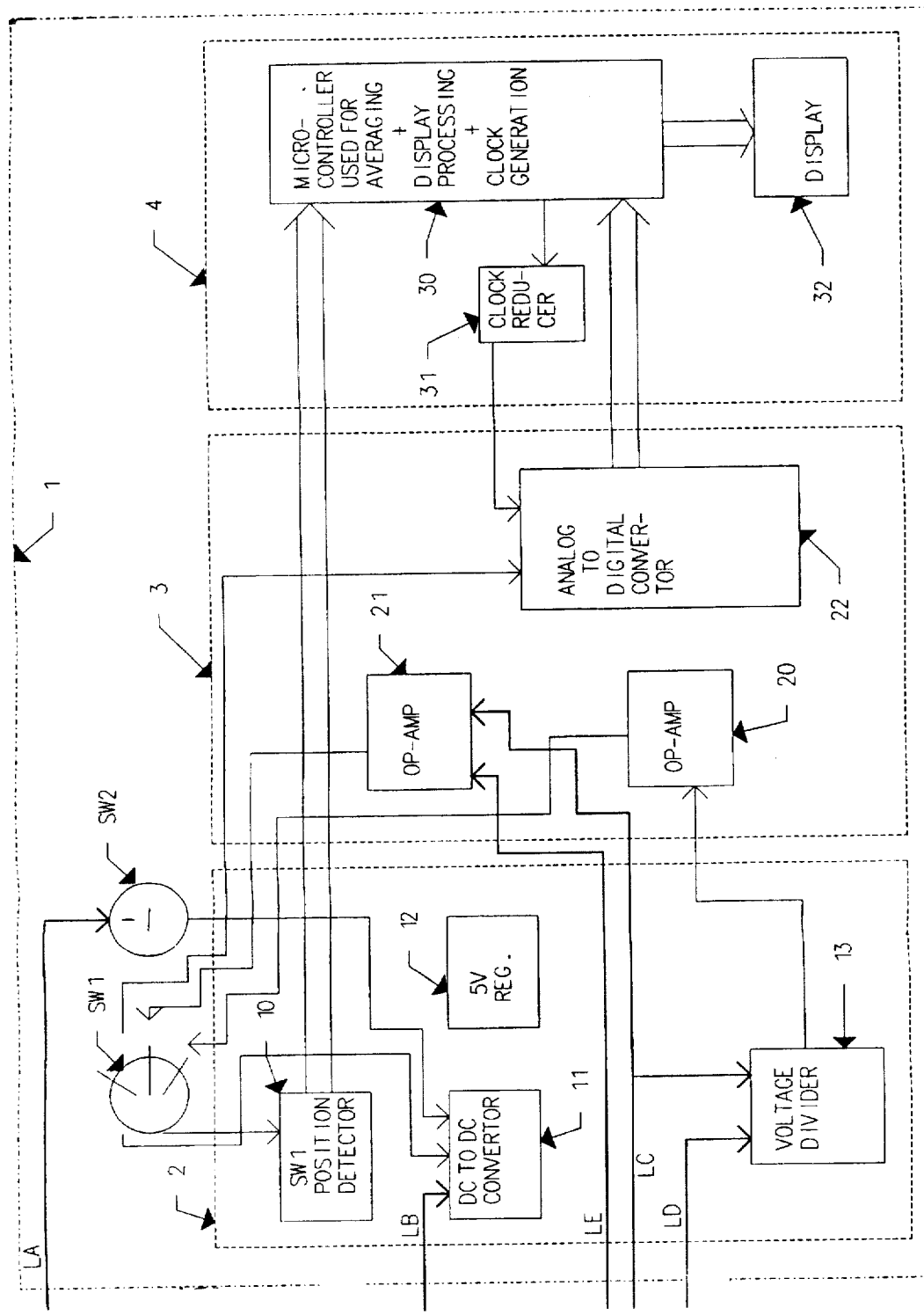

An apparatus for carrying out the present invention's method of reading a main generator voltage, a load test shunt millivoltage, and calculating the horse power of a locomotive is illustrated in FIG. 1, and includes a method and apparatus for reducing, switching and coupling voltages, an analog to digital converter, a microcontroller and a display. FIG. 1 illustrates a voltage metering device capable of a voltage and horse power reading.

Lines LE and LC as illustrated in FIG. 1 represent the input voltage from the load test used to determine the load test shunt millivoltage reading. LE represents the negative side and LC represent the positive side of the load test, both leads, LE and LC, are coupled to an amplifier 21. LC is also the common point that is provided on the locomotive. Amplifier 21 is an op-amp configured amplifier with a negative feedback. The input signal to amplifier 21 is amplified to a level of 0–750 mV. The amplifier 21, is configured as an operational amplifier, having a very high gain, high input impedance, a low output impedance and providing a stable signal. The output of the amplifier 21 is driven to SW1 which is coupled to amplifier 21.

Lines LD and LC as depicted in FIG. 1 represent the input voltages from the main generator. LD is the negative side of the main generator voltage and LC is the positive side. The two leads, LD and LC, are coupled to the voltage divider 13. Voltage divider 13 is a series of resistors used to reduce the voltage level from the two leads, LD and LC, and to prevent arcing within the device. The voltage divider 13 divides the 1–1500V input from leads LD and LC to a lower level of 1–200 mv. The voltage divider 13 provides a reduced voltage output being driven to an amplifier 20 which is coupled to the voltage divider 13. The input signal to amplifier 20 is amplified to a level of 0–2V DC. Amplifier 20 having an op-amp configuration with a negative feedback to provide high input impedance and a stable signal. The output from amplifier 20 is driven to SW1 which is coupled to amplifier 20.

Lines LA and LB as illustrated in FIG. 1 represent the 74 volt DC power supply used to power the invention. The 74 volt power supply is acquired from the locomotive and can fluctuate from about 36 to 80 volts and also occurring in spikes. LA is the positive side and LB is the negative side of the 74 volt DC power supply. The negative side of the 74 volt DC power supply LB is coupled to a DC to DC converter 11. The DC to DC converter 11 is utilized to reduce the input power supply of the locomotive from 74V DC to 12V DC as well as to provide isolation. The output from the DC to DC converter 11 is provided to a 5 volt regulator 12. The DC to DC converter 11 is coupled to the 5 volt regulator 12. The 5 volt regulator 12 reduces the 12V DC provided by the DC to DC converter 11 to 5V DC. LA the positive side of the 74 volt power supply is coupled to SW2. SW2 is also coupled to the DC to DC converter 11. The 5V DC is used as a power supply for all the components in the multimeter.

SW1 is preferably configured as a double pull throw switch used to switch the appropriate signal from the amplifiers 20 or 21 to the analog to digital converter 22. SW1 is preferably configured to read at three positions, an up, down and middle position. The middle position in one configuration being the horse power reading, the up position being the main generator reading, and the down being the shunt millivolt reading. The positions can have other configurations. SW1 as illustrated in FIG. 1 is coupled to amplifier 20 and 21 and also to a SW1 position detector 10, a DC to DC converter 11, and the analog to digital converter 22. SW1 position detector 10 preferably having an opto-isolator configuration to provide isolation. SW1 position detector is also coupled to microcontroller 30. SW1 position detector 10 will detect the position of SW1 and transfer the position to microcontroller 30. The SW1 position detector 10 will also take the supply voltage and isolate it.

SW2 as illustrated in FIG. 1 is coupled to the positive lead LA of the 74 volt power supply and also to the DC to DC convertor 11. SW2 can be configured to allow power to be supplied to the invention when the switch SW2 is depressed so that for a reading to be accomplished SW2 must be depressed.

A signal is then switched from the amplifiers 20 or 21 to the analog to digital converter 22. The analog to digital converter 22 converts the analog signals from the amplifiers 20 or 21 to digital signals, and the digital signals are then sent to a microcontroller 30. The analog to digital converter 22 is coupled to a clock reducer 31 which is coupled to the microcontroller 30. The clock reducer 31 provides a reduced clock rate to the analog to digital converter 22. The clock reducer 31 takes a high clock rate from the microcontroller 30 and reduces it to 125 Khz to drive the analog to digital converter.

The microcontroller 30 as illustrated in FIG. 1 is a microchip capable of data averaging, display processing, and clock generation. The microcontroller 30 is also capable of determining the horse power of the locomotive. The microcontroller 30 is coupled to the clock reducer 31 and supplies the clock reducer 31 with a clock rate. The display 32 is also coupled to the microcontroller 30 and is driven by the microcontroller 30 to display the voltages and horse power readings.

In the measurement of the main generator voltage, power is fed from LA directly through SW2 to the DC to DC converter 11. The DC to DC converter 11 converts and isolates this voltage down to 12V DC. This is then driven to the 5 volt regulator 12 which drops the voltage down to 5V DC. This will drive all components on the device. The signal is then switched from the amplifiers 20 to the analog to digital converter 22. The analog to digital converter 22 is also driven from the clock reducer 31 (divide by 8 counter). This provides a clock signal which is critical to the sampling that the analog to digital converter 22 performs. The clock reducer 31 is driven by the microcontroller 30 which outputs a fast clock signal.

The analog to digital converter 22 will convert the signal to a digital signal and will deliver the signal to the microcontroller 30. The microcontroller 30 will read the signal from the analog to digital converter 22 about four times and perform an averaging function. The result being a calculation that is sent to the display 32 which will display the reading on an LED display.

In the measurement of the load test shunt millivoltage, power is fed from LA lead of the 74V power supply directly through SW2 to the DC to DC converter 11, then to SW1, and SW1 position detector 10. The SW1 position detector 10 sends a signal to the microcontroller 30 as to the position of the SW1 switch. The DC to DC converter 11 converts and isolates the 74V DC down to 12V DC. This is then driven to the 5 volt regulator 12 which drops the voltage down to 5V DC. This will drive all components on the device. The signal is then switched from the amplifier 21 to the analog to digital converter 22. The analog to digital converter 22 is also driven from the clock reducer 31. This provides a clock signal that is critical to the sampling function that the analog to digital converter 22 performs. The clock reducer 31 is driven by the microcontroller 30 which outputs a fast clock signal.

The analog to digital converter 22 will convert the signal to a digital signal and will drive the microcontroller 30. The microcontroller 30 will read the signal from the analog to digital converter about four times and perform an averaging function. The result of this calculation is then sent to the display 32 which will show the reading on a LED display.

In the reading of the locomotive's horse power the microcontroller 30 must first receive the digital signals for both the main generator voltage and the load test shunt millivoltage. This is accomplished by first acquiring the main generator voltage and shunt millivolt readings. Once both voltages are acquired the horse power reading can be obtained. The horse power reading is acquired by the microcontroller 30 solving a mathematical equation. The microcontroller 30 can use the equation of 80 multiplied by the main generator voltage multiplied by the test load shunt millivoltage and the product of the multiplications divided by 700, or any other mathematical function that will produce a reading of the horse power of the locomotive. The results being delivered to the display 32 from the microcontroller 30 and displayed on a LED screen or any other suitable device.

The corresponding structure, material, acts and equivalents of all means or step plus function elements in the claims below are intended to include any structure, material, or acts for performing the functions in combination with other claimed elements as specifically claimed.

What is claimed:

1. An onboard digital locomotive multimeter to be installed on a locomotive to test a main generator voltage, a load test shunt millivoltage and to determine a horse power of a locomotive engine comprising:

a) a first switching means for switching, the first switching means being coupled to a power supply source, the first switching means also being coupled to a converter means for converting a DC voltage, the converter means being coupled to a regulator means for regulating a voltage to provide power for the digital locomotive multimeter;

b) a first amplifier means for amplifying and coupling tie load test shunt millivoltage;

c) a second switching means for switching being coupled to the first amplifier means;

d) a voltage divider means for dividing a voltage, the voltage divider means being coupled to the main generator voltage;

e) a second amplifier means for amplifying and coupling a voltage, the second amplifier means being coupled to the voltage divider means and the second amplifier means also being coupled to the second switching means;

f) a switch position detector means for detecting the position of the second switching means, the switch position detector means being coupled to the second switching means and the switch position detector means also being coupled to a microcontroller means for microprocessing;

g) the microcontroller means being able to calculate the horse power of the locomotive;

h) an analog to digital converter means for converting an analog signal to a digital signal, the analog to digital converter means being coupled to the second switching means and the analog to digital converter means also being coupled to the microcontroller means;

i) a clock reducing means for reducing a clock rate, the clock reducing means being coupled to the microcontroller means and the clock reducing means also being coupled to the analog to digital converter means; and j) a display means for displaying data, the display means being coupled to the microcontroller means.

2. The invention according to claim 1 wherein the power supply source is a 74 volt power supply source comprises a fluctuating 74 volt DC accessory power supply from the locomotive coupled to the first switching means, the first switching means also being coupled to the converter means which is a DC to DC converter which converts the 74 volts DC to 12 volts DC, the converter being coupled to a regulator means which is a regulator capable of reducing the 12 volts DC to 5 volts DC for providing power to the multimeter.

3. The invention according to claim 1, wherein the first and second amplifier means are amplifiers which have an op-amp configuration with negative feed back, the amplifiers also having high impedance and being able to prevent loading.

4. The invention according to claim 1, wherein the voltage divider means is a series of resistors capable of reducing a higher 1–1500V input voltage to a lower mV level.

5. The invention according to claim 1, wherein the switching means is a double pull throw switch used to control power to the meter, and the switching means also being capable of switching an appropriate signal from the amplifiers to the analog to digital converter means.

6. The invention according to claim 1, wherein the microcontroller means is a microchip capable of data averaging, display processing, clock generation and to determine the horse power of the locomotive.

7. An onboard digital locomotive multimeter to be installed on a locomotive to test a main generator voltage, a load test shunt millivoltage and to determine a horse power of a locomotive engine comprising:
   a) a first switch coupled to a power supply source, the first switch also being coupled to a DC to DC converter, the DC to DC converter being coupled to a regulator to provide power for the digital locomotive multimeter;
   b) a first amplifier coupled to the load test shunt millivoltage;
   c) a second switch coupled to the first amplifier;
   d) a voltage divider coupled to the main generator voltage;
   e) a second amplifier coupled to the voltage divider, and the second amplifier also being coupled to the second switch;
   f) a switch position detector coupled to the second switch, the switch position detector also being coupled to a microcontroller;
   g) the microcontroller being able to calculate the horse power of the locomotive;
   h) an analog to digital converter coupled to the switch, the analog to digital converter also being coupled to a clock reducer, and the analog to digital converter being coupled to the microcontroller;
   i) the clock reducer being coupled to the microcontroller and the clock reducer also being coupled to the analog to digital converter; and
   j) a display coupled to the microcontroller.

8. The invention according to claim 7, wherein the power supply source is a 74 volt power supply source comprising a fluctuating 74 volt DC accessory power supply from the locomotive coupled to the first switch, the first switch also being coupled to the DC to DC converter which converts the 74 volts DC to 12 volts DC, the converter being coupled to a regulator which is capable of reducing the 12 volts DC to 5 volts DC for supplying power to the multimeter.

9. The invention according to claim 7, wherein the first and second amplifier have an op-amp configuration with negative feed back, the amplifiers also having high impedance and prevent loading.

10. The invention according to claim 7, wherein the voltage divider is a series of resistors capable of reducing a higher 1-1500V input voltage to a lower mV level.

11. The invention according to claim 7, wherein the second switch is a double pull throw switch capable of switching an appropriate signal from the amplifiers to the analog to digital converter.

12. The invention according to claim 7, wherein the microcontroller means is a microchip capable of data averaging, display processing, clock generation and determining the horse power of the locomotive engine.

13. A method of determining a voltage from a main generator, a shunt millivoltage from a load test and determining a horse power on a locomotive engine comprising the steps of:
   a) acquiring and converting a locomotive accessory DC power supply source to a lowered DC voltage;
   b) amplifying and coupling the load test shunt millivoltage to produce an analog amplified load test shunt millivoltage;
   c) dividing the main generator voltage to produce a reduced voltage;
   d) amplifying and coupling the reduced voltage to produce an analog amplified reduced voltage;
   e) determining the position of the switch to produce a switch position;
   f) converting the analog amplified reduced voltage to a digital voltage signal and converting the analog amplified load test shunt millivoltage to a digital millivoltage signal;
   g) microprocessing the digital voltage signal, the digital millivoltage signal and the switch position to produce a processed data; and
   h) displaying the processed data.

14. The method according to claim 13, wherein the power supply source is a 74 volt power supply source comprising a fluctuating 74 volt DC accessory power supply from the locomotive coupled to a first switch, the first switch also being coupled to a DC to DC converter which converts the 74 volts DC to 12 volts DC, the converter being coupled to a regulator which is capable of reducing the 12 volts DC to 5 volts DC for supplying power to the multimeter.

15. The method according to claim 13, wherein amplifying and coupling are accomplished by amplifiers which have an op-amp configuration with negative feed back, the amplifiers also having high impedance and being able to prevent loading.

16. The method according to claim 13, wherein the voltage is divided by a series of resistors capable of reducing a higher 1-1500V input voltage to a lower mV level.

17. The method according to claim 13, wherein the microprocessing step is accomplished by a microchip capable of data averaging, display processing, clock generation and calculating the horse power of the locomotive engine.

18. The method according to claim 13, wherein the processed data includes the main generator voltage, the shunt millivoltage and the horse power of the locomotive.

* * * * *